(12) United States Patent
Xiao et al.

(10) Patent No.: US 8,385,102 B2
(45) Date of Patent: Feb. 26, 2013

(54) ALTERNATING BIPOLAR FORMING VOLTAGE FOR RESISTIVITY-SWITCHING ELEMENTS

(75) Inventors: Li Xiao, San Jose, CA (US); Abhijit Bandyopadhyay, San Jose, CA (US); Tao Du, Palo Alto, CA (US)

(73) Assignee: SanDisk 3D LLC, Milpitas, CA (US)

( * ) Notice: Subject to any disclaimer, the term of this patent is extended or adjusted under 35 U.S.C. 154(b) by 155 days.

(21) Appl. No.: 12/949,590

(22) Filed: Nov. 18, 2010

(65) Prior Publication Data

US 2011/0280059 A1 Nov. 17, 2011

Related U.S. Application Data

(60) Provisional application No. 61/333,533, filed on May 11, 2010.

(51) Int. Cl.
*G11C 11/00* (2006.01)

(52) U.S. Cl. .......................................... 365/148; 365/163

(58) Field of Classification Search ................... 365/148
See application file for complete search history.

(56) References Cited

U.S. PATENT DOCUMENTS

| 5,825,046 | A | 10/1998 | Czubatyj et al. |
| 6,870,768 | B2 | 3/2005 | Cernea et al. |
| 7,006,371 | B2 | 2/2006 | Matsuoka |
| 7,400,528 | B2 * | 7/2008 | Happ et al. ............... 365/185.03 |
| 7,480,174 | B2 | 1/2009 | Lee et al. |
| 7,558,099 | B2 | 7/2009 | Morimoto |
| 7,826,248 | B2 * | 11/2010 | Xi et al. ......................... 365/148 |
| 8,144,494 | B2 * | 3/2012 | Takase ............................. 365/51 |
| 2006/0199377 | A1 * | 9/2006 | Ufert ............................. 438/637 |
| 2008/0007993 | A1 * | 1/2008 | Saitoh et al. .................. 365/158 |
| 2008/0151601 | A1 | 6/2008 | Kang et al. |
| 2009/0003044 | A1 | 1/2009 | Happ et al. |
| 2009/0086521 | A1 | 4/2009 | Herner et al. |
| 2009/0135637 | A1 * | 5/2009 | Takase ............................. 365/51 |
| 2009/0258489 | A1 | 10/2009 | Chen et al. |
| 2009/0272962 | A1 * | 11/2009 | Kumar et al. ..................... 257/4 |

(Continued)

FOREIGN PATENT DOCUMENTS

| JP | 2007004873 A | 1/2007 |
| WO | 2005059921 A1 | 6/2005 |

(Continued)

OTHER PUBLICATIONS

You-Lin Wu, et al., "The Degradation of Thin Silicon Dioxide Film Subjected to Pulse Voltage Stresses at Nanoscale", Dielectrics for Nanosystems 4: Materials Science, Processing, Reliability, and Manufacturing, vol. 28, Issue 2—Apr. 25-30, 2010.

(Continued)

*Primary Examiner* — Son Mai
(74) *Attorney, Agent, or Firm* — Vierra Magen Marcus & DeNiro LLP

(57) ABSTRACT

A method and system for forming reversible resistivity-switching elements is described herein. Forming refers to reducing the resistance of the reversible resistivity-switching element, and may refer to reducing the resistance for the first time. Prior to forming the reversible resistivity-switching element it may be in a high-resistance state. The method may comprise alternating between applying one or more first voltages having a first polarity to the memory cell and applying one or more second voltages having a second polarity that is opposite the first polarity to the memory cell until the reversible resistivity-switching memory element is formed. There may be a rest period between applying the voltages of opposite polarity.

24 Claims, 12 Drawing Sheets

600

Alternating between applying one or more first voltages having a first polarity to the memory cell and applying one or more second voltages having a second polarity that is opposite the first polarity to the memory cell until the reversible resistivity-switching memory element is formed ~ 602

U.S. PATENT DOCUMENTS

| | | | |
|---|---|---|---|
| 2009/0285007 | A1 | 11/2009 | Majewski et al. |
| 2010/0067281 | A1 | 3/2010 | Xi et al. |
| 2010/0265757 | A1* | 10/2010 | Otsuka .......................... 365/148 |
| 2010/0271860 | A1* | 10/2010 | Muraoka et al. .............. 365/148 |
| 2011/0085370 | A1* | 4/2011 | Chen et al. .................... 365/148 |

FOREIGN PATENT DOCUMENTS

| | | |
|---|---|---|
| WO | 2010038442 A1 | 4/2010 |
| WO | 2011044261 A1 | 4/2011 |

OTHER PUBLICATIONS

U.S. Appl. No. 12/642,191, filed Dec. 18, 2009.
U.S. Appl. No. 12/948,375, filed Nov. 17, 2010.
U.S. Appl. No. 12/948,388, filed Nov. 17, 2010.
Kin P. Cheung, "Can TDDB continue to serve as reliability test method for advance gate dielectric?", International Conference on Integrated Circuit Design and Technology, 2004.
Akihito Sawa, "Resistive switching in transition metal oxides", materialstoday, Jun. 2008, vol. 11, No. 6.
Jeong, Doo S. et al., Characteristic electroforming behavior in Pt/TiO2/Pt resistive switching cells depending on atmosphere,' Journal of Applied Physics, American Institute of Physics, vol. 104, No. 12, Dec. 23, 2008, New York, USA, 8 pages.
International Search Report and Written Opinion of the International Searching Authority dated Jul. 18, 2011, PCT Application No. PCT/US2011/035802, filed May 9, 2011, 11 pages.
English Abstract of Foreign Patent Document JP2007004873, Published Jan. 11, 2007, Applicant Sony Corporation, 1 page.

* cited by examiner

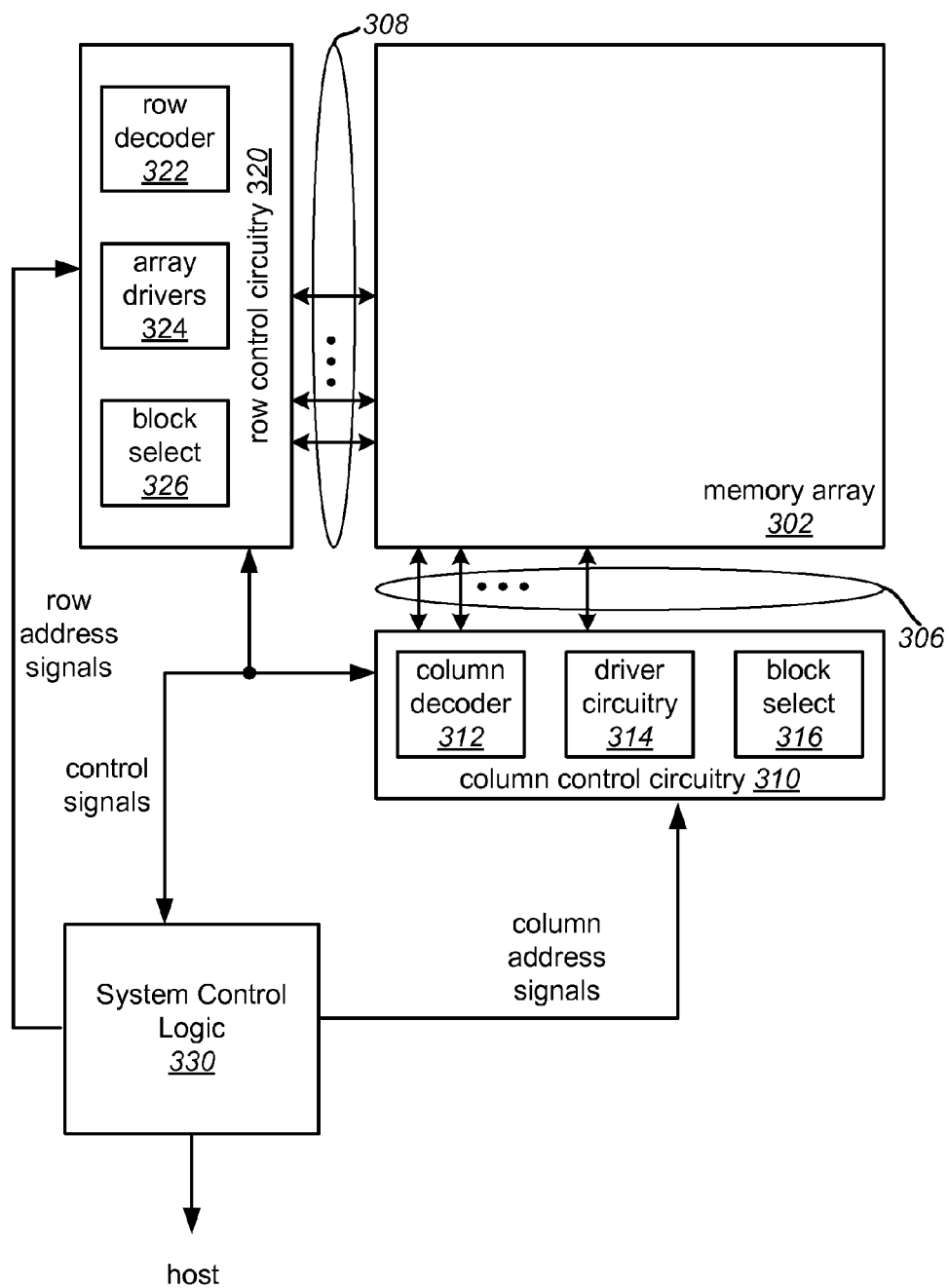

ALTERNATING BIPOLAR FORMING VOLTAGE FOR RESISTIVITY-SWITCHING ELEMENTS

PRIORITY

This application claims the benefit of U.S. Provisional Application No. 61/333,533, entitled "Alternating Bipolar Forming Voltage for Resistivity-Switching Elements," by Xiao et al., filed on May 11, 2010, incorporated herein by reference.

BACKGROUND

1. Field

This application relates to technology for non-volatile storage.

2. Description of the Related Art

Materials having a detectable level of change in state, such as a resistance, are used to form various types of non-volatile semiconductor based memory cells. It has been proposed that such memory cells might be used for binary data storage in memory arrays by assigning a lower resistance state of a memory cells to a first logical state such as logical '0,' and assigning a higher resistance state of the memory cell to a second logical state such as logical '1.' Other logical data assignments to resistance states may also be used. Some materials can be reset back to a higher resistance state after being set from an initial state to a lower resistance state. These types of materials can be used to form re-writable memory cells. Multiple levels of detectable resistance in materials might be used to form multi-state memory cells which may or may not be re-writable.

One type of memory cell that exhibits switching behavior between at least two resistance states is referred to as ReRAM for "resistive switching RAM". ReRAM may also be referred to as R-RAM or RRAM. A ReRAM memory cell may include a first electrode, a re-writable switching material (also referred to as a state change element), and a second electrode. The switching material may be metal oxide ($MeO_x$). Switching the memory cell between resistance states may be achieved by applying a voltage across the memory cell. An alternative way of explaining the switching between resistance states is to provide a current to the memory cell.

One theory that is used to explain the switching mechanism for some types of switching materials is that one or more conductive filaments are formed by the application of a voltage (or other signal) to the memory cell. For some types of switching materials (e.g., metal oxides), the conductive path may arise due to oxygen vacancies that are caused by application of the voltage. This path (or paths) may link the first and second electrodes, wherein the conductive filament(s) lowers the resistance of the memory cell. Application of another voltage may rupture the conductive filament(s), thereby increasing the resistance of the memory cell. Application of still another voltage may repair the rupture in the conductive filament(s), thereby decreasing the resistance of the memory cell once again. Note that other theories might be used to explain switching behavior.

The reversible resistivity-switching element may be in the high resistance state when it is first fabricated. The term "FORMING" is sometimes used to describe putting the reversible resistivity-switching element into a lower resistance state for the first time. Thus, the initial formation of the conductive filaments is sometimes referred to as "FORMING." The rupture of the filaments is sometimes referred to as RESETTING. The repair of the rupture of the filaments is sometimes referred to as SETTING. Note that there may be other explanations for FORMING, RESETTING, and SETTING.

One problem with the process of FORMING is that all of the non-volatile storage elements in a memory array need to be formed, which can be very time consuming. Further note that the FORMING process may need to be applied in a product environment. Therefore, the FORMING process should take place at temperatures that are compatible with the products.

Note that switching behavior might be explained by other theories than those above. Thus, any of the reversible resistivity-switching elements described herein are not limited to the theories for switching behavior described herein.

BRIEF DESCRIPTION OF THE DRAWINGS

FIG. 4 is a block diagram of one embodiment of a memory system.

DETAILED DESCRIPTION

A method and system for FORMING memory cells have reversible resistivity-switching elements is described herein. FORMING refers to reducing the resistance of the reversible resistivity-switching element, and may refer to reducing the resistance for the first time. In one embodiment, the polarity of the voltage that is applied to the memory cell when forming the memory cell is alternated between application of voltages. For example, one or more voltages having one polarity are applied to the memory cell, then one or more voltages having the opposite polarity are applied. There may be a rest period between application of the voltages of opposite polarity. Forming by the use of voltages of opposite polarity may be referred to herein as "bipolar forming."

In one embodiment, the memory cell includes a metal oxide region between a top electrode and a bottom electrode. The metal oxide region may serve as the reversible resistivity-switching element. One voltage polarity may apply a higher bias to the top electrode than the bottom electrode. The other voltage polarity may apply a lower bias to the top electrode than the bottom electrode. Thus, voltages of opposite polarity may be applied across the metal oxide region during the forming process.

Figure 1A:
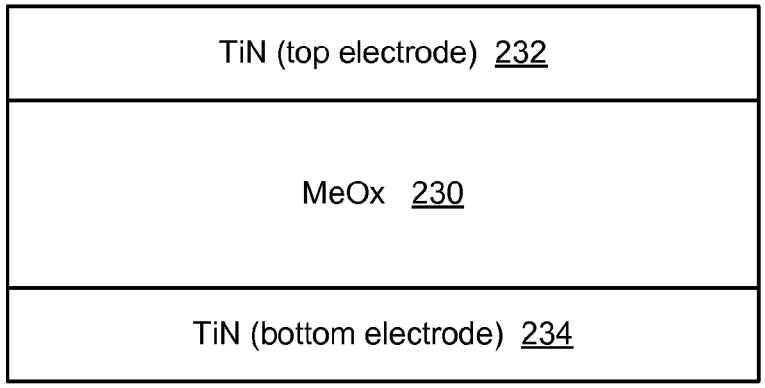
FIGS. 1A-1C depict embodiments of reversible resistivity-switching elements having metal oxide switching elements.
Figure 1B:
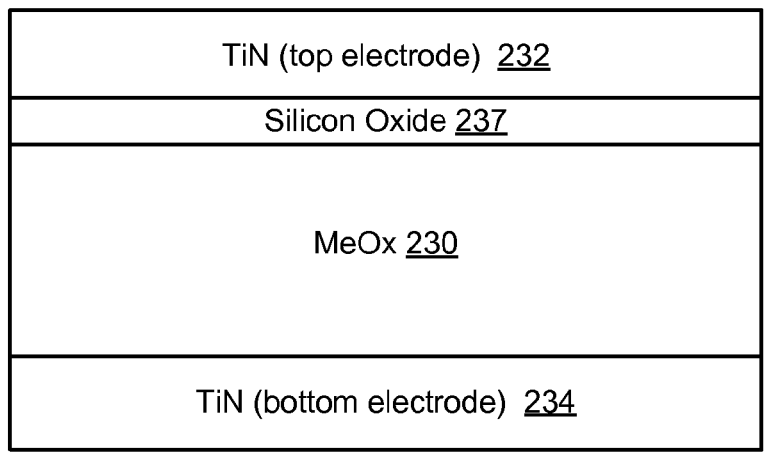
Figure 1C:
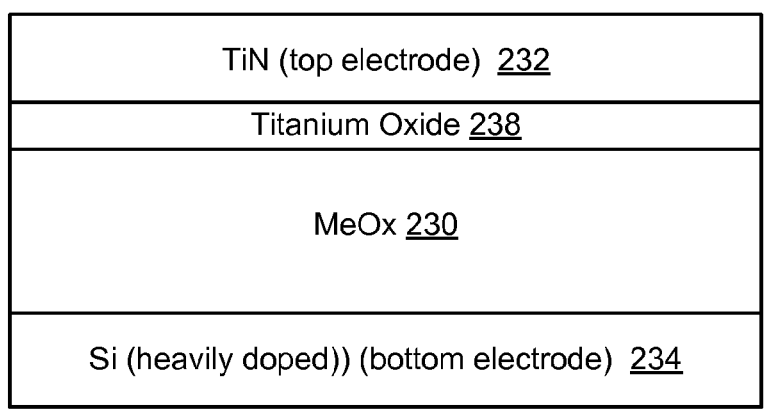

FIGS. 1A-1C depict embodiments of reversible resistivity-switching elements 202 having metal oxide switching elements 230. FIG. 1A depicts one example of materials that might be used in one embodiment of a reversible resistivity-switching element 202. The top electrode 232 and bottom electrodes 234 are each TiN in this example. The reversible resistivity switching material 230 is metal oxide in this example. FIG. 1B depicts another example in which there is a silicon oxide layer 237 between the top electrode 232 and metal oxide 230. As one example, the metal oxide may be about 6-8 nm thick and the $SiO_2$ may be 1.5-2 nm thick. Note that the top and bottom electrodes are not required to be the same material. FIG. 1C depicts an embodiment of a reversible resistivity-switching element 202 in which the bottom electrode 234 is heavily doped silicon and the top electrode is TiN. In this embodiment, there is an optional region of titanium oxide 238 between the metal oxide layer 230 and the top electrode 232.

One theory that is used to explain the FORMING mechanism, as well as the switching mechanism to RESET and SET the memory cell, is that one or more conductive filaments are formed by the application of a voltage to the reversible resistivity-switching element 202. Referring to the example reversible resistivity-switching elements 202 of FIGS. 1A-1C, the conductive filaments may be formed in the metal oxide 230, such that there is one or more conductive paths from the top electrode 232 to the bottom electrode 234. Thus, the conductive filaments lower the resistance of the reversible resistivity-switching element 202. Application of another voltage may rupture the conductive filaments, thereby increasing the resistance of the reversible resistivity-switching element 202. Application of still another voltage may repair the rupture in the conductive filaments, thereby decreasing the resistance of the reversible resistivity-switching element 202 once again.

The reversible resistivity-switching element may be in the high resistance state when it is first manufactured. The term "FORMING" is sometimes used to describe putting the reversible resistivity-switching element into a lower resistance state for the first time. Thus, the initial formation of the conductive filaments is sometimes referred to as "FORMING." The rupture of the filaments is sometimes referred to as RESETTING. The repair of the rupture of the filaments is sometimes referred to as SETTING. The memory cell may then be repeatedly switched between states by repeatedly RESETTING and SETTING the memory cell. Note that how the original FORMING procedure was performed may impact the ability of the memory cell to be reliably and accurately RESET and SET.

FORMING may be a critical event in metal oxide-based RRAM storage devices. FORMING may impact the ability of the storage element to exhibit proper switching behavior. For example, the storage element should switch between the high resistance state and the low resistance state in response to appropriate voltages, which may be referred to as "switching within the intended window."

Figure 2A:
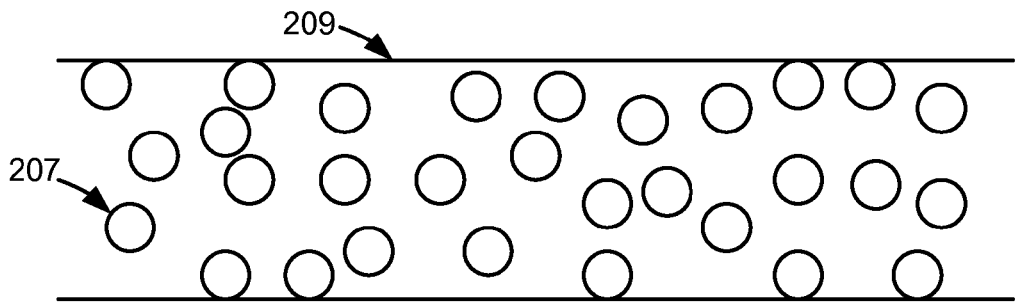
FIGS. 2A-2D depict TDDB for a dielectric material TDDB for purposes of illustration.

One theory to explain FORMING is that it may be a soft dielectric breakdown which generates and move oxygen vacancies to form conductive filaments. Thus, one way to think about FORMING is to compare it to time dependent dielectric breakdown (TDDB). FIGS. 2A-2D depict TDDB for a dielectric material for purposes of illustration. In TDDB, percolation paths may be formed. Note that the following may occur, at least in part, to application to a voltage across the dielectric. FIG. 2A shows a layer of dielectric material 209 having neutral traps 207. These neutral traps 207 may have formed at random locations in the dielectric material 209 due to application of one or more voltages across the dielectric material 209.

Figure 2B:
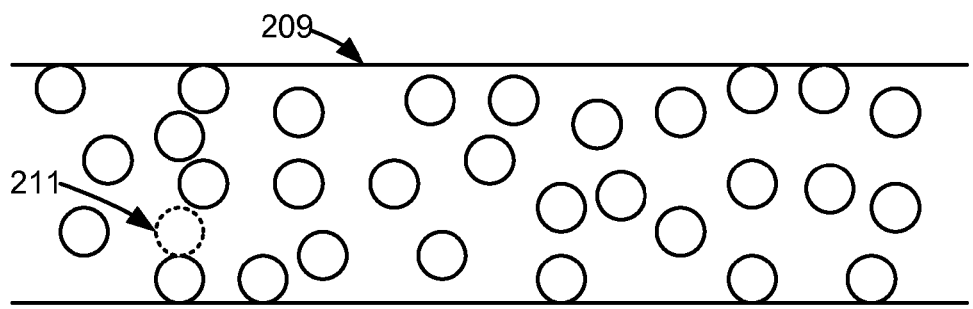
Figure 2C:
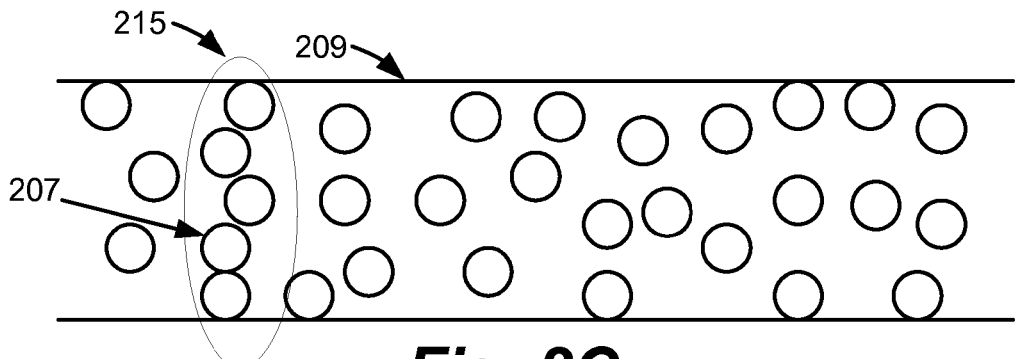
Figure 2D:
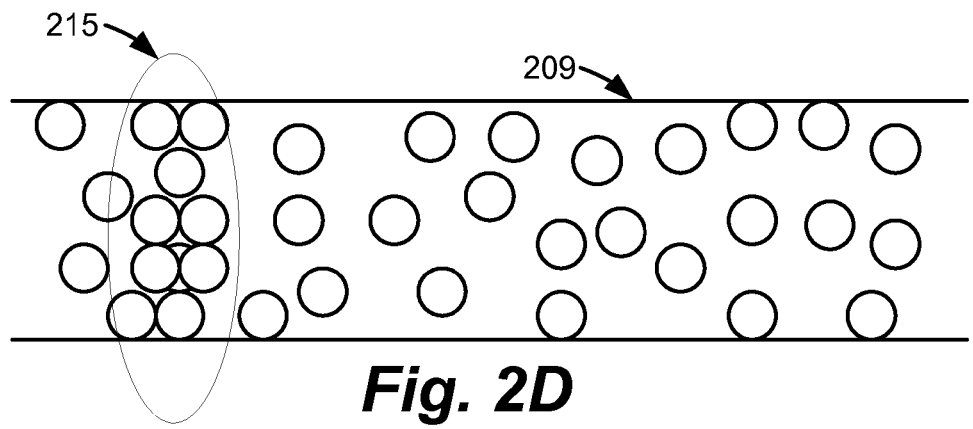

The dielectric material 209 may have "defect precursor sites," which may be able to capture a positive charge to form an "intermediate state." FIG. 2B shows an intermediate state 211 that has formed by the capture of a positive charge. The intermediate state 211 could lose the positive charge to return to being a defect precursor site. However, if the intermediate state 211 captures an electron, then it becomes a "neutral trap." FIG. 2C shows the case in which an electron was captured by an intermediate state 211 to form a neutral trap 207. At this point, a percolation path 215 has been formed across the dielectric material 209. The percolation path 215 may be considered to be a permanent path. When the percolation path 215 is formed, it is possible that there may be a surge in current across the dielectric material 209. This surge in current may enlarge the percolation path 215 significantly, as depicted in FIG. 2D. Note that FORMING in a metal oxide 230 does not necessarily occur in the same way as TDDB for a dielectric material 209. Regardless, it may be useful to consider TDDB when analyzing FORMING in a metal oxide 230.

The following observations have been made by the inventors regarding FORMING. Controlling the percolation path (or conductive filaments) that forms during the FORMING process may be important in having the storage element switch within its intended window. For example, controlling the conductivity of the percolation path may be important.

One possible technique to exercise control over the FORMING process is to slowly ramp up the FORMING voltage that is applied with each successive FORMING voltage. The current may also be limited to gain further control. However, even with a slow voltage ramp, with current limit, the storage element may jump to un-controlled higher FORMING current level (e.g., >1 µA). By "forming current level" it is meant the current that will be read after applying a voltage during FORMING to determine whether FORMING is complete. In other words, the resistance of the storage element may suddenly drop to a very low level. As mentioned, this may be detrimental to switching behavior.

Typically, the memory cells are part of a large array of memory cells. Techniques that ramp up the forming voltage very slowly take a long time to successfully FORM all of the memory cells. One approach to handle the forming problems (especially in array) is to start with lower voltage stress with extremely small increment of voltage so as to avoid sudden stress on the film of the storage element. However, this also adds up time penalty. Also, since the storage element needs to undergo many more pulses there may be more stress on the storage element.

Thus, despite attempts to control the FORMING current through algorithms (in the array domain) it is observed that the FORMING operation still takes a long time—which may be impractical for product implementation.

However, the inventors have observed that stressing the metal oxide 230 of the storage element with alternate polarity voltages (e.g., pulses) may offer better conductivity control of the percolation path. Further, alternating the polarity of the voltages may reduce the forming time. One possible explanation involves the way in which traps are formed. Trap generation may be different for the forward and reverse voltages. In some embodiments that use bipolar forming voltages, the median FORMING time may be about 2 microseconds. In contrast, some conventional techniques (applying voltages having the same polarity) may have a median FORMING time of about 1 second. In some embodiments that use bipolar forming voltages, more than 99 percent of memory cells may be FORMED in under 100 microseconds.

Traps may be generated by injection from one interface as a result of the forward forming voltage with the traps generated by injection from the other interface as a result of the reverse forming voltage. This may build up a continuous conductive path between top electrode (TE) and the bottom electrode (BE). The formation of the conductive path may also depend on the magnitude and duration of the voltages, as well as the stress interruption time between voltages.

Embodiments using bipolar forming voltages may achieve a high yield. That is, a high number of memory cells may pass the FORMING process. However, the forming time may be very low. For example, it may only take a very few cycles to FORM the storage element. Thus, the short forming time does not come at the expense of a lower yield. The bipolar FORMING method is not believed to have any fundamental issues/limitations in terms of damaging/altering interfaces etc. For example, storage elements that are formed using bipolar FORMING may be stressed (e.g., SET/RESET cycling) and not show any differences in cycling behavior such as ON/OFF level or window, etc. than methods that do not use bipolar FORMING. Also read stability of memory cells that are formed using bipolar FORMING does not appear to show any problem/issues as compared to techniques using other than bipolar FORMING.

However, note that the total forming time for FORMING all storage elements in a memory array (such as a 3D memory array) may be significantly less when using alternating bipolar FORMING voltages, as compared to some techniques that do not use bipolar FORMING pulses.

Memory Cell and System

Figure 3A:
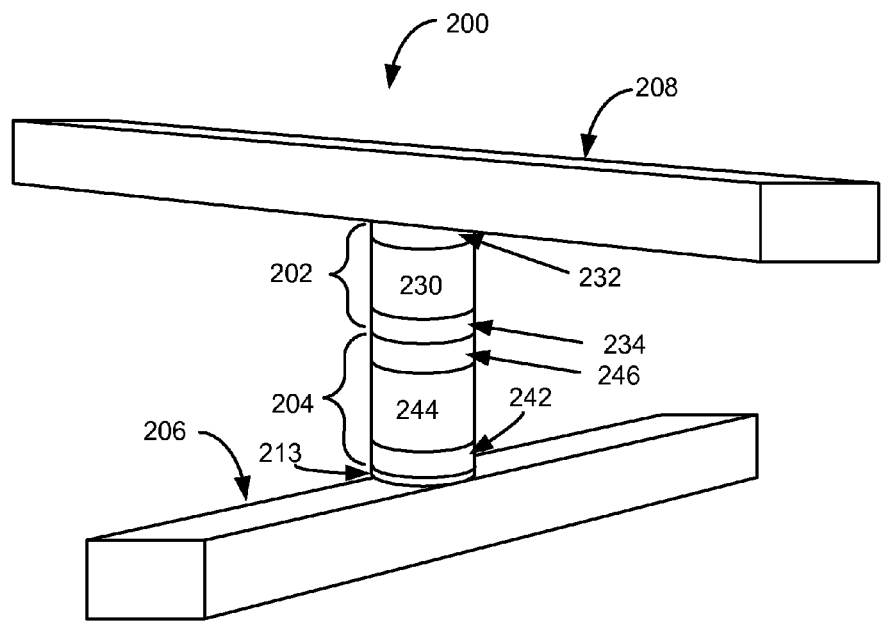
FIG. 3A is a simplified perspective view of one embodiment of a memory cell.

Prior to discussing details of FORMING a memory cell, an example memory cell and system will be discussed. FIG. 3A is a simplified perspective view of one embodiment of a memory cell 200 which includes a reversible resistivity-switching element 202 coupled in series with a steering element 204 between a first conductor 206 and a second conductor 208. In some embodiments, the steering element 204 is a diode. In one embodiment, the diode steering element 204 is a p-i-n diode. In one embodiment, a p-i-n diode includes a p-doped region, an intrinsic region, and an n-doped region. In one embodiment, the diode steering element 204 is a punch-thru diode. A punch-thru diode used as a steering element may be may be a N+/P−/N+ device or a P+/N−/P+ device. In one embodiment, the diode steering element 204 is a Schottky diode. In one embodiment, the diode steering element 204 is a back-to-back Schottky diode. In some embodiments, diode 204 may be formed from a polycrystalline semiconductor material such as polysilicon, germanium, or another semiconductor. Also, the diode steering element 204 may comprise more than one type of semiconductor. For example, diode 204 may be formed from a polycrystalline silicon-germanium alloy, polygermanium or any other suitable combination of semiconductors. In some embodiments, each region 242, 244, 246 of the diode steering element 204 is formed from the same material (but doped differently). However, it is not required that each region be formed from the same material. For example, a heterostructure may be possible.

However, the steering element 204 is not limited to being a diode. In one embodiment, the steering element 204 is a transistor. For example, a Field Effect Transistor (FET) can be used for the steering element 204. FIG. 3E, which will be discussed later, depicts a schematic of a part of a memory array in which the steering element 204 is an FET.

The memory cell 200 has a reversible resistivity-switching element 202 that includes a reversible resistivity-switching material 230, an upper electrode 232, and a lower electrode 234. The example reversible resistivity-switching elements 202 of FIGS. 1A-1C may be used in the memory cell 200. Electrode 232 is positioned between reversible resistivity-switching material 230 and conductor 208. In one embodiment, electrode 232 is made of TiN. Electrode 234 is positioned between reversible resistivity-switching material 230 and steering element 204. In one embodiment, electrode 234 is made of titanium nitride.

The memory cell 200 has an electrode 213 at the bottom of the memory cell 200 to facilitate electrical contact between the steering element 204 and other circuit elements. In one embodiment, electrode 213 is formed from TiN. Note that the relative positions of the steering element 204 and the memory element 202 could be reversed. For example, the steering element 204 could be above the memory element 202.

Reversible resistivity-switching element 202 includes reversible resistivity-switching material 230 having a resistance that may be reversibly switched between two or more states. For example, the reversible resistivity-switching material may be in an initial high-resistance state upon fabrication that is switchable to a low-resistance state upon application of a first physical signal. For example, the reversible resistivity-switching element 202 may switch states in response to application of a first amount of energy, charge, heat, voltage, current or other phenomena. Application of a second amount of energy, charge, heat, voltage, current or other phenomena may return the reversible resistivity-switching material to the high-resistance state. Alternatively, the reversible resistivity-switching element may be in an initial low-resistance state upon fabrication that is reversibly switchable to a high-resistance state upon application of the appropriate energy, charge, heat, voltage, current or other phenomena. When used in a memory cell, one resistance state may represent a binary "0" while another resistance state may represent a binary "1." However, more than two data/resistance states may be used.

In some embodiments, reversible resistivity-switching material 230 may be formed from a metal oxide. Various different metal oxides can be used. The metal-oxide may a transition metal-oxide. Examples of metal-oxides include, but are not limited to, NiO, $Nb_2O_5$, $TiO_2$, $HfO_2$, $Al_2O_3$, $MgO_x$, $CrO_2$, VO, BN, and AlN. In one embodiment, the memory element electrodes 232, 234 are formed from TiN. More information about fabricating a memory cell using reversible resistivity-switching material can be found in United States Patent Application Publication 2009/0001343, filed on Jun. 29, 2007, entitled "Memory Cell that Employs a Selectively Deposited Reversible Resistance Switching Element and Methods of Forming the Same," which is hereby incorporated herein by reference in its entirety.

Conductors 206 and 208 may include any suitable conductive material such as tungsten, any appropriate metal, heavily-doped semiconductor material, a conductive silicide, a conductive silicide-germanide, a conductive germanide, or the like. In the embodiment of FIG. 3A, conductors 206 and 208 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 206 and 208 to improve device performance and/or aid in device fabrication.

While the reversible resistivity-switching element 202 is shown as being positioned above the steering element 204 in FIG. 3A, it will be understood that in alternative embodiments, the reversible resistivity-switching element 202 may be positioned below the steering element 204.

Figure 3B:
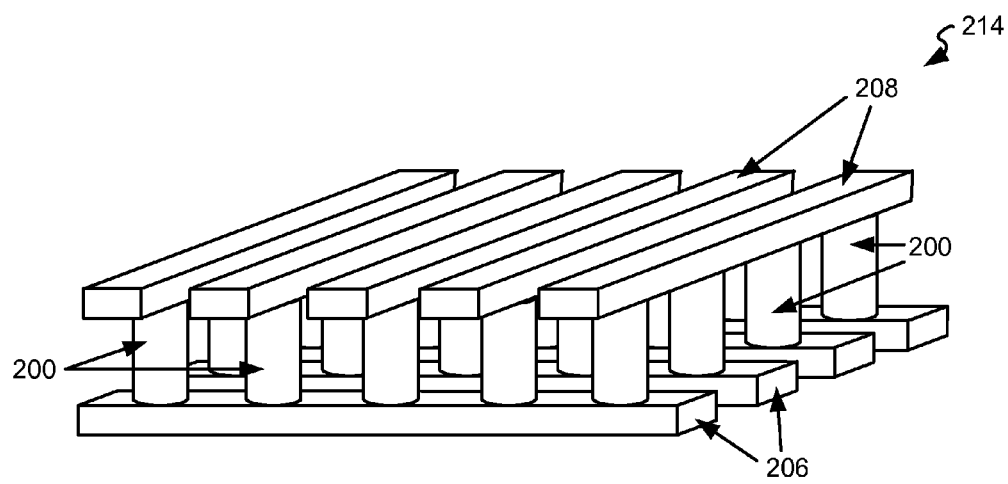
FIG. 3B is a simplified perspective view of a portion of a first memory level formed from a plurality of the memory cells of FIG. 3A.

FIG. 3B is a simplified perspective view of a portion of a first memory level 214 formed from a plurality of the memory cells 200 of FIG. 3A. For simplicity, the reversible resistivity-switching element 202 and the steering element 204 are not separately shown. The memory array 214 is a "cross-point" array including a plurality of first conductors 206 (e.g., bit lines) and a plurality of second conductors 208 (e.g., word lines) between which multiple memory cells are coupled (as shown). Other memory array configurations may be used, as may multiple levels of memory.

Figure 3C:
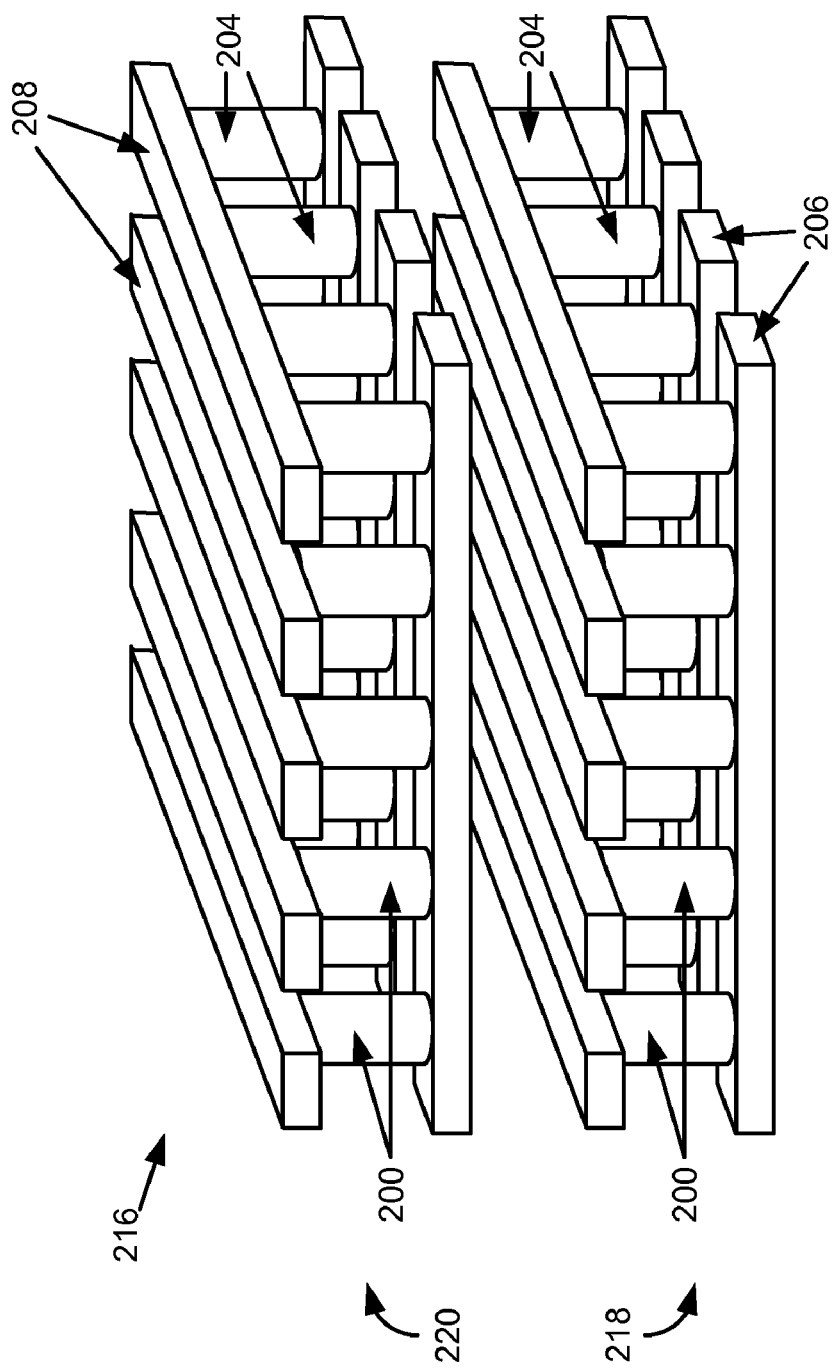
FIG. 3C is a simplified perspective view of a portion of a three dimensional memory array.

FIG. 3C is a simplified perspective view of a portion of a monolithic three dimensional array 216 that includes a first memory level 218 positioned below a second memory level 220. In the embodiment of FIG. 3C, each memory level 218 and 220 includes a plurality of memory cells 200 in a cross-point array. It will be understood that additional layers (e.g., an inter-level dielectric) may be present between the first and second memory levels 218 and 220, but are not shown in FIG. 3C for simplicity. Other memory array configurations may be used, as may additional levels of memory.

Figure 3D:
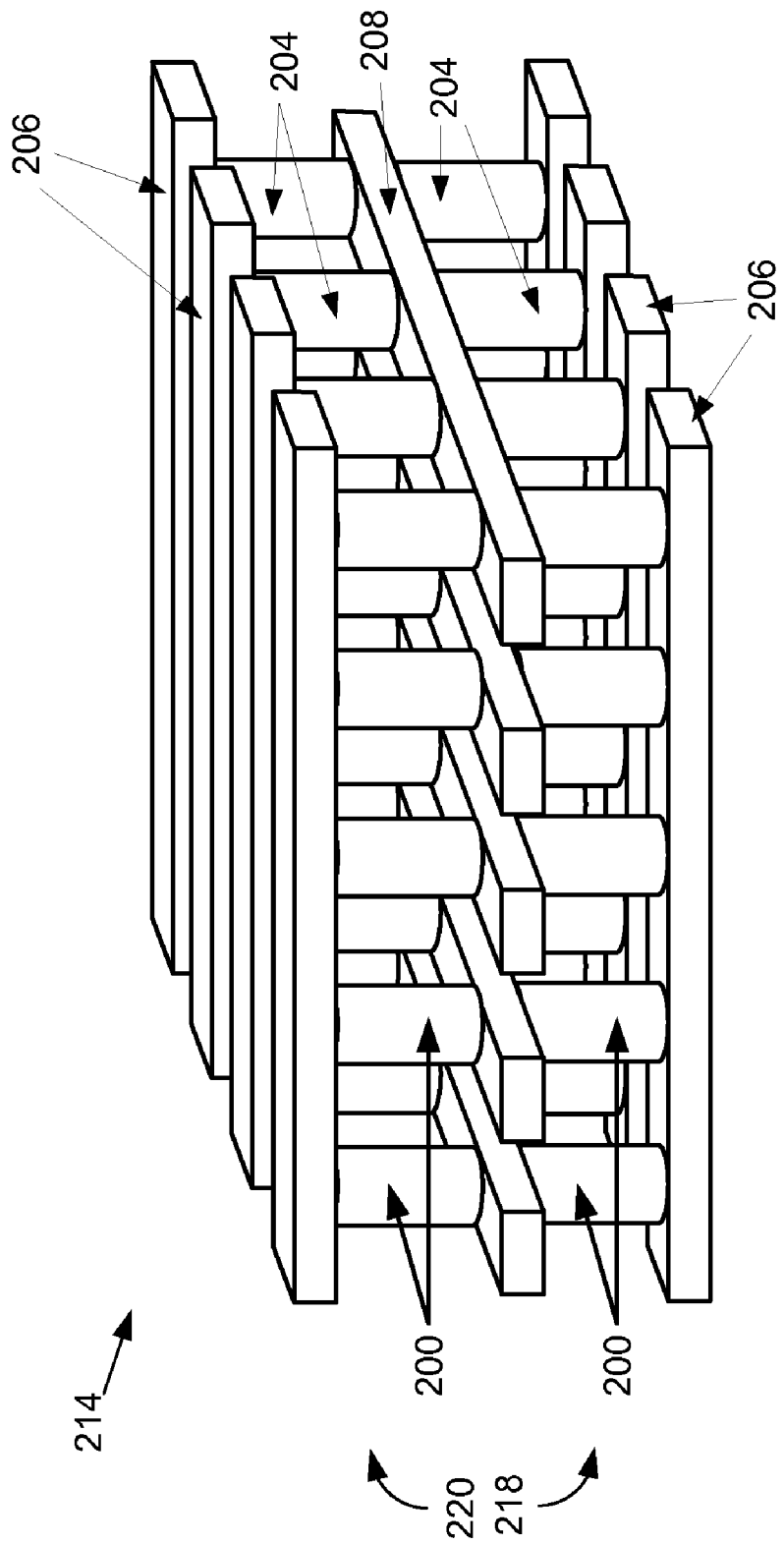
FIG. 3D is a simplified perspective view of a portion of a three dimensional memory array.
Figure 3E:
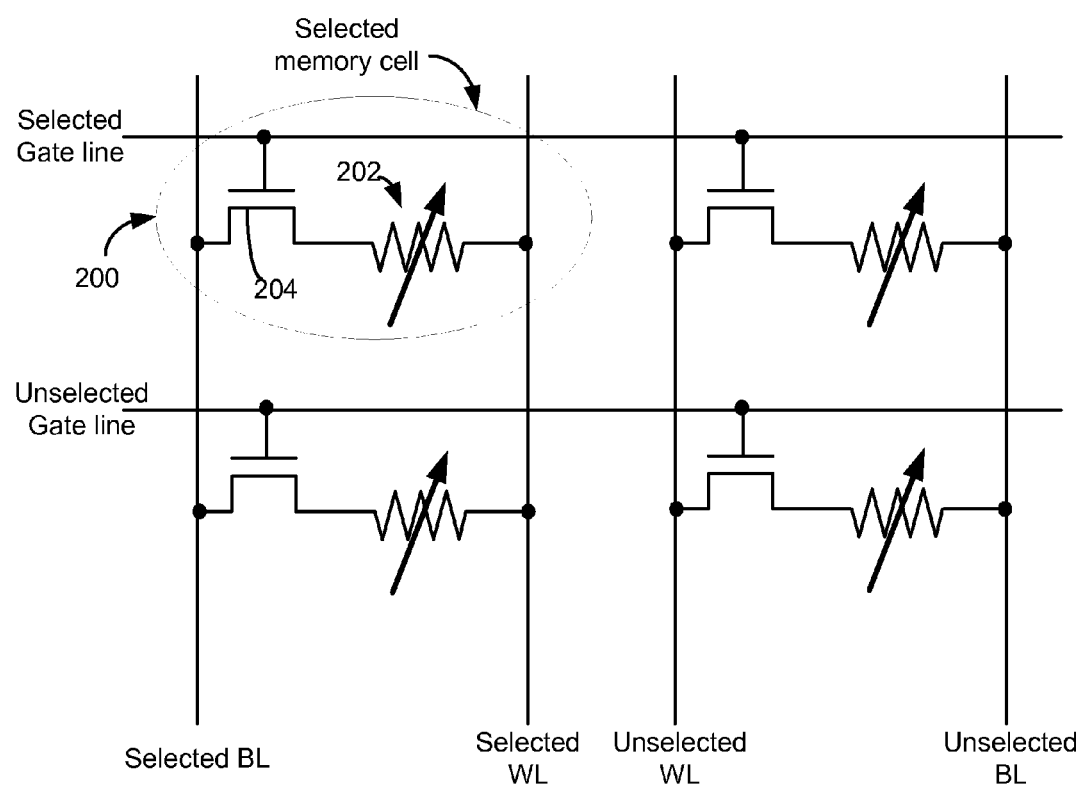
FIG. 3E depicts one embodiment of a portion of a memory array that uses FETs as steering elements.

In some embodiments, the memory levels may be formed as described in U.S. Pat. No. 6,952,030, "High-Density Three-Dimensional Memory Cell," which is hereby incorporated by reference herein in its entirety. For instance, the upper conductors of a first memory level may be used as the lower conductors of a second memory level that is positioned above the first memory level as shown in FIG. 3D.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

FIGS. 3A-3D show memory cells in a cylindrical shape and conductors in the shapes of rails according to the disclosed arrangements. However, the technology described herein is not limited to any one specific structure for a memory cell. Other structures can also be used to form memory cells that include reversible resistivity-switching material. For example, the following patents provide examples of structures of memory cells that can be adapted to use reversible resistivity-switching material: U.S. Pat. Nos. 6,952,043; 6,951,780; 6,034,882; 6,420,215; 6,525,953; and 7,081,377.

As previously mentioned, the steering element 204 is not required to be a diode. FIG. 3E depicts one embodiment of a schematic of a portion of a memory array that uses FETs as steering elements 204. In this embodiment, the memory cell 200 may be a three terminal device. Note that when using an FET for a steering element the memory array may have a different architecture than those depicted in FIGS. 3B-3D. Each memory element 200 includes a reversible resistivity-switching element 202 and a steering element 204, which as stated is an FET. Each memory cell 200 resides between a bit line and a word line. The selected memory cell 200 resides between a selected word line and a selected bit line. The FET of the selected memory cell 200 is connected to the selected gate line. The voltage that is applied to the selected gate line controls the current that is allowed to flow through the reversible resistivity-switching element 202. For example, the gate voltage may be selected to limit the current through the reversible resistivity-switching element 202 to a desired level.

FIG. 4 is a block diagram that depicts one example of a memory system 300 that can implement the technology described herein. Memory system 300 includes a memory array 302 that can be a two or three dimensional array of memory cells as described above. In one embodiment, memory array 302 is a monolithic three dimensional memory array. The array terminal lines of memory array 302 include the various layer(s) of word lines organized as rows, and the various layer(s) of bit lines organized as columns. However, other orientations can also be implemented.

Memory system 300 includes row control circuitry 320, whose outputs 308 are connected to respective word lines of the memory array 302. Row control circuitry 320 receives a group of M row address signals and one or more various control signals from System Control Logic circuit 330, and typically may include such circuits as row decoders 322, array terminal drivers 324, and block select circuitry 326 for both read and programming (e.g., FORMING, SET and RESET) operations. Memory system 300 also includes column control circuitry 310 whose input/outputs 306 are connected to respective bit lines of the memory array 302. Column control circuitry 306 receives a group of N column address signals and one or more various control signals from System Control Logic 330, and typically may include such circuits as column decoders 312, array terminal receivers or drivers 314, block select circuitry 316, as well as read/write circuitry, and I/O multiplexers. In one embodiment column decoder 312 is a reversible polarity decoder circuit. In one embodiment row decoder 322 is a reversible polarity decoder circuit. In one embodiment, a reversible polarity decoder circuit has active low output in one mode and active high output in another mode. Further details of reversible polarity decoder circuits are described in U.S. Pat. No. 7,542,370, filed on Dec. 31, 2006, which is hereby incorporated herein in its entirety.

System control logic 330 receives data and commands from a host and provides output data to the host. In other embodiments, system control logic 330 receives data and commands from a separate controller circuit and provides output data to that controller circuit, with the controller circuit communicating with the host. System control logic 330 may include one or more state machines, registers and other control logic for controlling the operation of memory system 300.

Integrated circuits incorporating a memory array usually subdivide the array into a number of sub-arrays or blocks. Blocks can be further grouped together into bays that contain, for example, 16, 32, or a different number of blocks. Each block in a 3-D memory may have many layers of memory cells. For example, a block might include 8 layers. Each layer may include hundreds, or thousands of bit lines and word lines. For example, a layer might have about a thousand bit lines and about 8 thousand word lines. In some implementations, there is a bit line driver associated with each bit line. Note that a given driver could be shared between two or more bit lines. Also note that it is not required that a given bit line have only one driver associated therewith. In some implementations, some of the drivers are physically located on one end of the bit lines and other drivers on the other end of the bit lines.

As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

In one embodiment, all of the components depicted in FIG. 4 are arranged on a single integrated circuit. For example, system control logic 330, column control circuitry 310, and row control circuitry 320 are formed on the surface of a substrate and memory array 302 is a monolithic three dimensional memory array formed above the substrate (and, therefore, above system control logic 330, column control circuitry 310 and row control circuitry 320). In some cases, a portion of the control circuitry can be formed on the same layers as some of the memory array 302.

Figure 5:
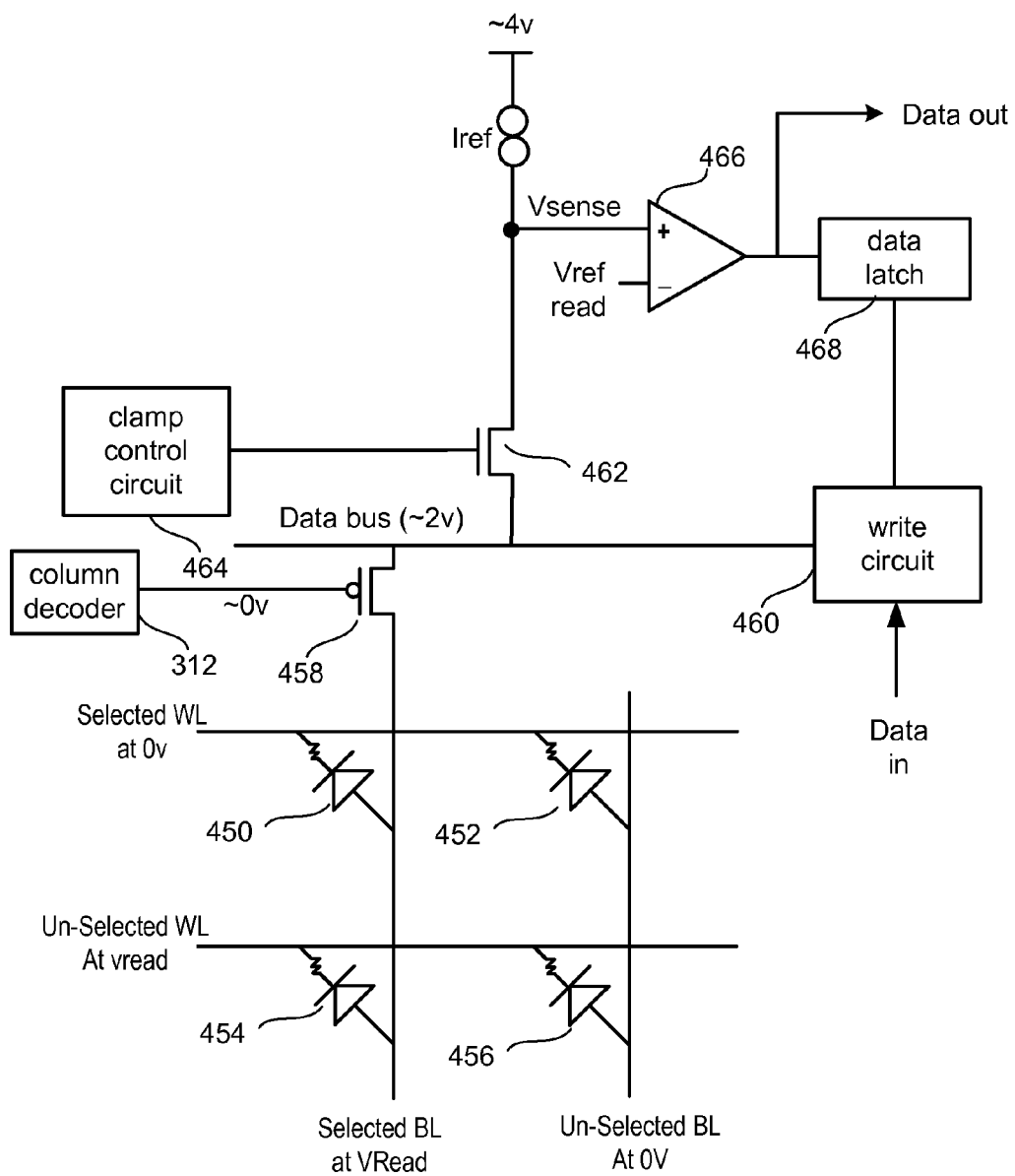
FIG. 5 depicts a circuit that can read the state of a memory cell.

FIG. 5 depicts a circuit that illustrates one embodiment for reading the state of a memory cell. To determine which state the reversible resistance-switching element 202 is in, a voltage may be applied and the resulting current is measured. A higher measured current indicates that the reversible resistance-switching element 202 is in the low-resistivity state. A lower measured current indicates that the reversible resistance-switching element 202 is in the high-resistivity state. FIG. 5 shows a portion of a memory array including memory cells 450, 452, 454 and 456, which may be based on the embodiments of FIGS. 3A, 3B, 3C, and 3D. In this example, the steering element 204 is a diode. Two of the many bit lines and two of the many word lines are depicted. A read circuit for one of the bit lines is depicted to be connected to the bit line via transistor 458, which is controlled by a gate voltage supplied by column decoder 312 in order to select or unselect the corresponding bit line. Transistor 458 connects the bit line to a Data bus. Write circuit 460 (which is part of system control logic 330) is connected to the Data bus. Transistor 462 connects to the Data bus and operates as a clamp device that is controlled by clamp control circuit 464 (which is part of system control logic 330). Transistor 462 is also connected to comparator 466 and reference current supply $I_{REF}$. The output of comparator 466 is connected to a data out terminal (to system control logic 330, a controller and/or a host) and to data latch 468. Write circuit 460 is also connected to data latch 468.

When attempting to read the state of the reversible resistivity-switching element, all word lines are first biased at Vread (e.g., approximately 2 volts) and all bit lines are at ground. The selected word line is then pulled to ground. For example purposes, this discussion will assume that memory cell 450 is selected for reading. One or more selected bit lines are pulled to Vread through the data bus (by turning on transistor 458) and the clamp device (transistor 462, which receives ~2 volts+Vt). The clamp device's gate is above Vread but controlled to keep the bit line near Vread. Current is pulled by the selected memory cell through transistor 462 from the $V_{SENSE}$ node. The $V_{SENSE}$ node also receives a reference current $I_{REF}$ that is between a high-resistance state current and a low-resistance state current. The $V_{SENSE}$ node moves corresponding to the current difference between the cell current and the reference current $I_{REF}$. Comparator 466 generates a data out signal by comparing the $V_{SENSE}$ voltage to a Vref-read voltage. If the memory cell current is larger than $I_{REF}$, the memory cell is in the low-resistance state and the voltage at $V_{SENSE}$ will be lower than $V_{REF}$. If the memory cell current is smaller than $I_{REF}$, the memory cell is in the high-resistance state and the voltage at $V_{SENSE}$ will be higher than $V_{REF}$. The data out signal from comparator 466 is latched in data latch 468. In some embodiments, the reference current is based on the address of the memory cell.

Figure 6:
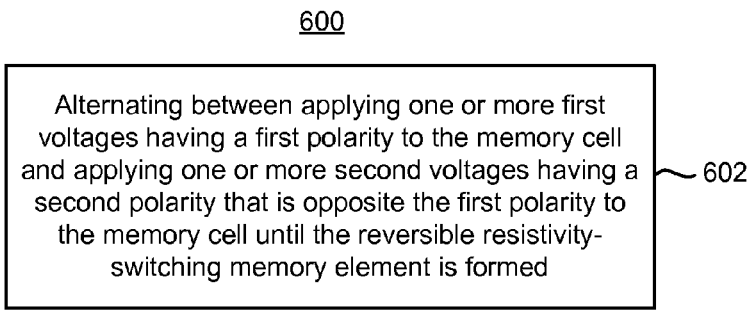
FIG. 6 depicts one embodiment of a process of FORMING a memory cell.

FIG. 6 depicts one embodiment of a process 600 of FORMING a memory cell 200. As noted above, FORMING is an operation in which the resistance of the memory cell 200 is changed. In some embodiments, FORMING results in lowering the resistance of the memory cell 200.

Step 602 includes alternating between applying one or more first voltages having a first polarity to the memory cell 200 and applying one or more second voltages having a second polarity that is opposite the first polarity to the memory cell 200 until the reversible resistivity-switching memory element is formed. There may be a rest period between application of the one or more first voltages and the application of the one or more second voltages.

Referring to any of FIGS. 1A-1C, as examples, the one or more first voltages having the first polarity might result in the top electrode 232 being at a higher voltage than the bottom electrode 234. Conversely, the one or more second voltages having the second polarity might result in the top electrode 232 being at a lower voltage than the bottom electrode 234. Therefore, the voltage across the metal oxide 230 is alternated between application of the voltages of opposite polarities.

As noted above, there may be differences in how traps are generated when applying the voltages of opposite polarities. For example, one possibility is that traps may be generated by injection from the top electrode/metal oxide interface as a result of one voltage and by injection from the bottom electrode/metal oxide interface as a result of the voltage of the opposite polarity. The formation of the conductive path may also depend on the magnitude and duration of the voltages, as well as the stress interruption time between voltages. Therefore, in some embodiments, the magnitude of the first voltage is different from the second. In some embodiments, the duration of the first voltage is different from the second voltage. For example, the first voltage has a different pulse duration than the second voltage.

Figure 7:
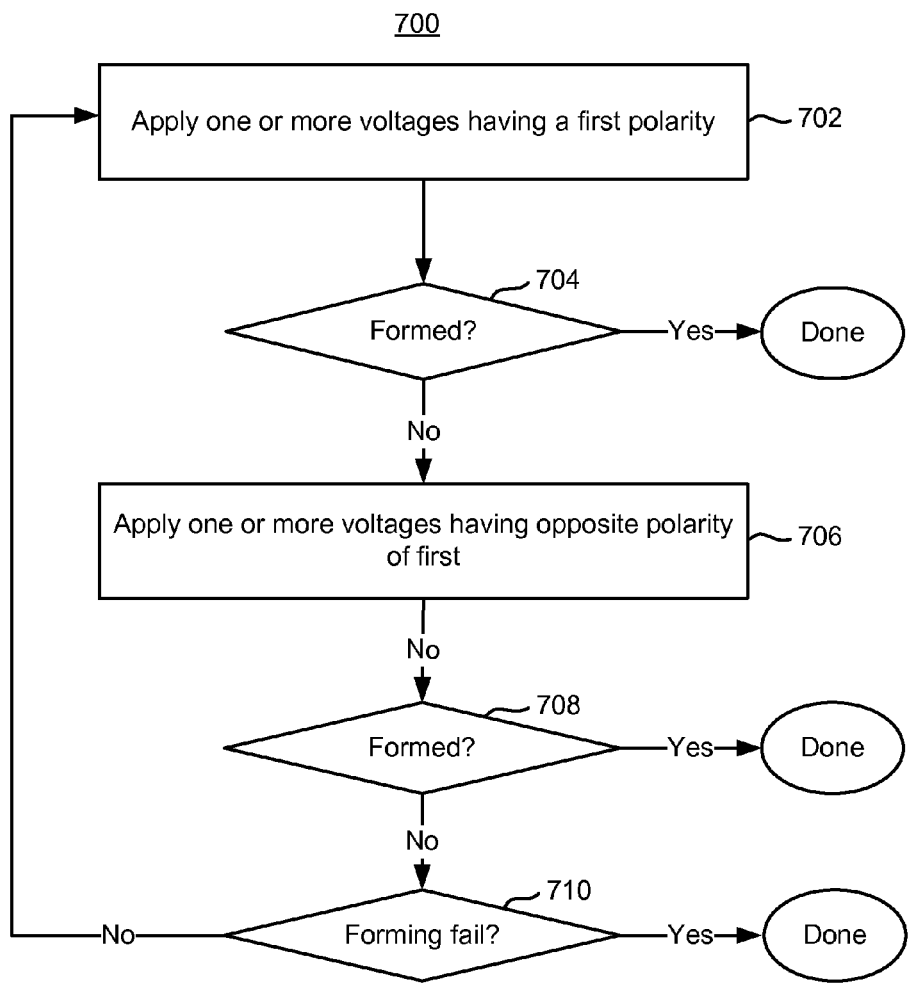
FIG. 7 is a flowchart of one embodiment of a process of FORMING a memory cell.

FIG. 7 is a flowchart of one embodiment of a process 700 of FORMING a memory cell 200. Process 700 is one embodiment of step 602 of FIG. 6. In step 702, one or more voltages having a first polarity are applied to the memory cell 200. Each of the one or more voltages may be a voltage pulse, but other forms could be used. In one embodiment, the one or more voltages forward bias a steering element 204, such as a diode. In one embodiment, the one or more voltages reverse biases a steering element 204, such as a diode. Note that in some cases the memory cell 200 may have a steering element 204 that does not necessarily have a forward bias and a reverse bias. For example, some diodes may have a symmetrical current-voltage relationship. Also, the memory cell 200 might have a device such as an FET as a steering element.

As noted above, a memory cell 200 may have what is referred to as a top electrode 232 and a bottom electrode 234. In one embodiment, the one or more voltages may result in a higher voltage at the top electrode 232 than the bottom electrode 234. In one embodiment, the one or more voltages may result in a higher voltage at the bottom 234 electrode than the top electrode 232.

In step 704, a determination is made whether the memory cell 200 is formed as a result of applying the one or more voltages in step 702. The determination may be based on one or more FORMING criterion. As one example, a voltage is applied across the memory cell 200 and a resulting current is sensed. The FORMING criterion may be whether the current is greater than a certain amount. In this case, the FORMING criterion, in effect, tests for whether the resistance of the memory cell 200 is below some target level. If the memory cell 200 is formed, then the process ends.

If the memory cell 200 is not yet formed, then one or more voltages having a second polarity are applied to the memory cell 200. The second polarity is opposite to the first polarity. For example, if the one or more voltages in step 702 forward biased a steering element 204, then the one or more voltages in step 706 may reverse bias the steering element 204. On the other hand, if the one or more voltages in step 702 reverse biased a steering element 204, then the one or more voltages in step 706 may forward bias the steering element 204. As noted above, the memory cell 200 does not necessarily have a steering element 204 that has a forward bias and reverse bias condition.

As noted above, a memory cell 200 may have what is referred to as a top electrode 232 and a bottom electrode 234. The one or more voltages in step 706 may reverse the voltage relationship on the electrodes that was achieved in step 702. For example, if step 702 resulted in the top electrode 232 at a higher voltage than the bottom electrode 234, then step 706 may result in the top electrode 232 at a lower voltage than the bottom electrode 234. On the other hand, if step 702 resulted in the top electrode 232 at a lower voltage than the bottom electrode 234, then step 706 may result in the top electrode 232 at a higher voltage than the bottom electrode 234.

Note that it is not required that the same number of voltages be used in steps 702 and 706. For example, there might be one voltage pulse in step 702 and more than one voltage pulse in step 706. Also, if the voltages are voltage pulses, it is not required that the pulses have the same duration in steps 702 as 706. In one embodiment, step 702 uses a short duration pulse (or pulses) and step 706 uses a long duration pulse (or pulses). In one embodiment, step 702 uses a long duration pulse (or pulses) and step 706 uses a short duration pulse (or pulses).

In some embodiments, the memory cell 200 FORMING may tend to occur more in step 706 than in step 702. For example, conductive paths of oxygen vacancies may tend to form in a metal oxide region 230 to a greater extent in step 706 than in step 702. The conductive paths of oxygen vacancies might not form at all in step 702, as one possibility. Another possibility is that step 702 might tend to reverse the formation of conductive paths of oxygen vacancies. In other embodiments, the memory cell FORMING may tend to occur more in step 702 than in step 706.

After applying the one or more voltages in step 706, a determination may be made as to whether the memory cell 200 is formed, in step 708. This test may be similar to step 704. If the memory cell 200 is formed, then the process 700 may end. Note that it in some embodiments rather than testing at both steps 704 and 708, testing is only performed at one of these steps. As noted, memory cell 200 FORMING may be expected to occur to a greater extent in, for example, step 706 than in step 702. In this case, the test of step 704 might be skipped.

If the memory cell 200 is not formed (step 708 is no), then a determination may be made, in step 710, whether the FORMING process failed. For example, there may be a limited number of times that alternating between the two polarity of voltage might be attempted. Another test might be used, such as measuring a current of the memory cell 200 to test for possible damage to the memory cell 200. If it is determined that FORMING has failed, then the process 700 ends. Otherwise, the process 700 returns to step 702 to apply one or more voltages having the first polarity to the memory cell 200.

Figure 8A:
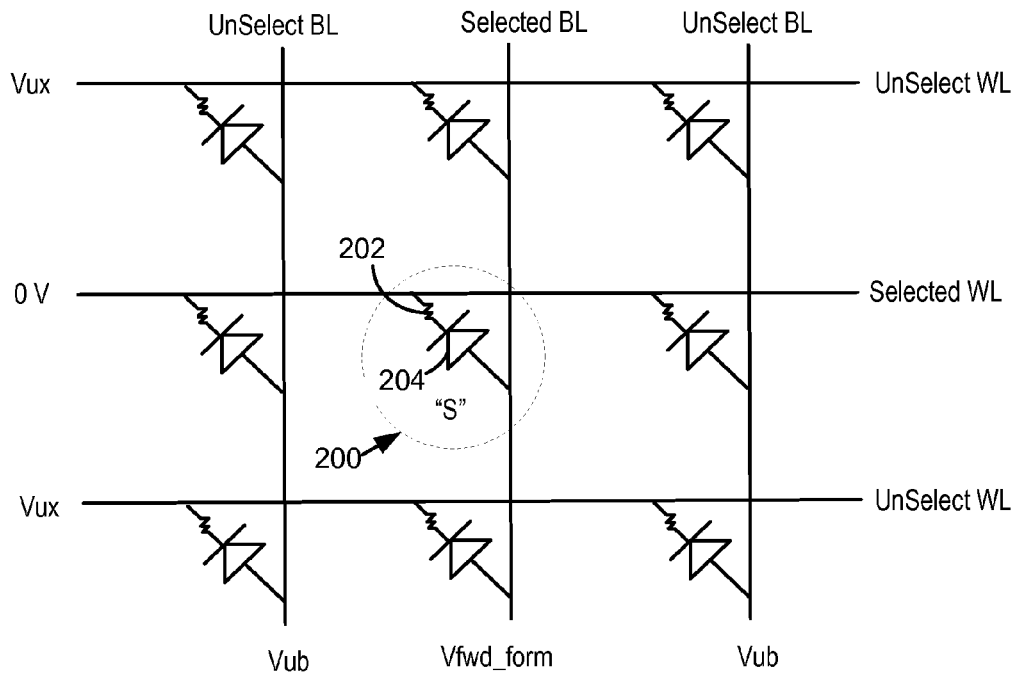
FIGS. 8A and 8B depicts example array biasing schemes that may be used to apply voltages of opposite polarity to a memory cell.
Figure 8B:
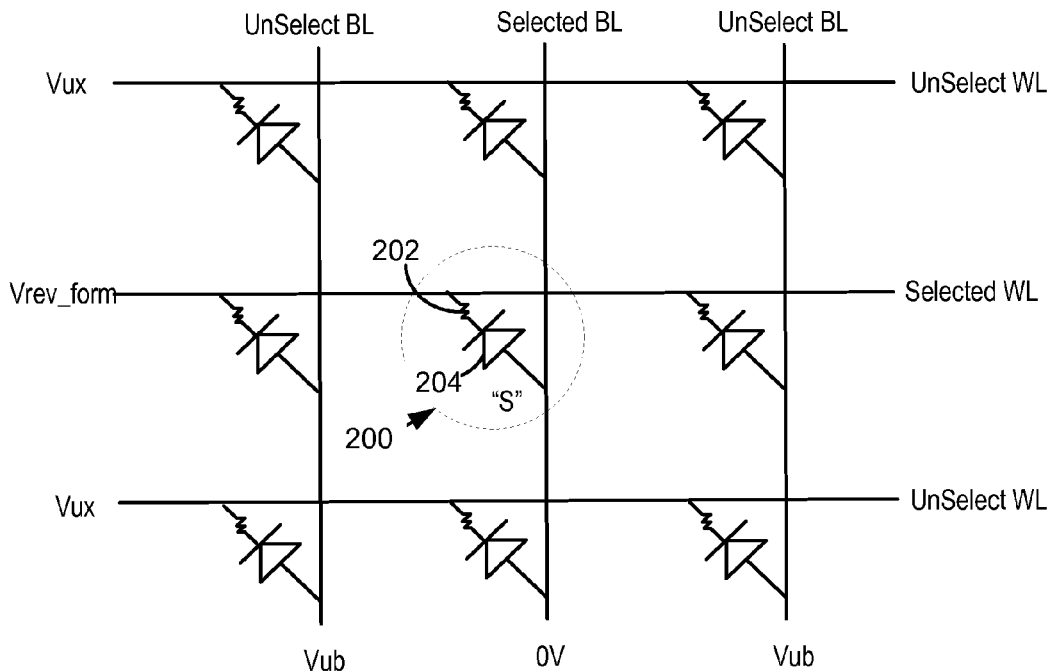

FIGS. 8A and 8B depicts example array biasing schemes that may be used to apply voltages of opposite polarity to a memory cell 200. FIG. 8A depicts one embodiment of an array biasing scheme for applying a voltage having a first polarity to a memory cell 200 that has reversible resistivity switching element 202 and a diode 204 as a steering element. FIG. 8B depicts one embodiment of an array biasing scheme for applying a voltage having a second polarity (opposite the first polarity) to a memory cell 200 that has reversible resistivity switching element 202 and a diode 204 as a steering element. Thus, if the scheme of FIG. 8A is used in step 702 of process 700, then the scheme of FIG. 8B may be used in step 706 of process 700. On the other hand, if the scheme of FIG. 8B is used in step 702 of process 700, then the scheme of FIG. 8A may be used in step 706 of process 700. The example array biasing schemes may also be used when implementing step 602 from process 600 in FIG. 6.

Referring now to FIG. 8A, the diode 204 of the selected memory cell 200 ("S") is forward biased. In this biasing scheme, Vfwd_form is applied to the selected bit line (BL) while the selected word line (WL) is grounded. As an example, Vfwd_form may be in the range from about 4.0V to about 7.0V. However, Vfwd_form could be higher or lower. Unselected word lines each have Vux applied thereto. In one embodiment, Vux is about Vfwd_form−0.7V. This results in about 0.7V across unselected memory cells 200 that are along the selected bit line. Unselected bit lines each have Vub applied thereto. In one embodiment, Vub is about 0.7V. This results in about 0.7V across unselected memory cells 200 that are along the selected word line. The diodes 202 of memory cells 200 along both an unselected word line and an unselected bit line may be reverse biased. In one embodiment, such memory cells 200 have about −(Vfwd_form−1.4 V) across them (from bit line to word line). Note that the voltages are presented as examples and that other voltages could be used.

Referring now to FIG. 8B, the diode 204 of the selected memory cell 200 is reverse biased. In this biasing scheme, Vrev_form is applied to the selected word line (WL) while the selected bit line (BL) is grounded. As an example, Vrev_form may be in the range from about 8.0V to about 9.0V. However, Vrev_form could be higher or lower. Unselected word lines each have Vux applied thereto. In one embodiment, Vux is about Vrev_form/2. Unselected bit lines each have Vub applied thereto. In one embodiment, Vub is about Vrev_form/2.

Figure 9A:
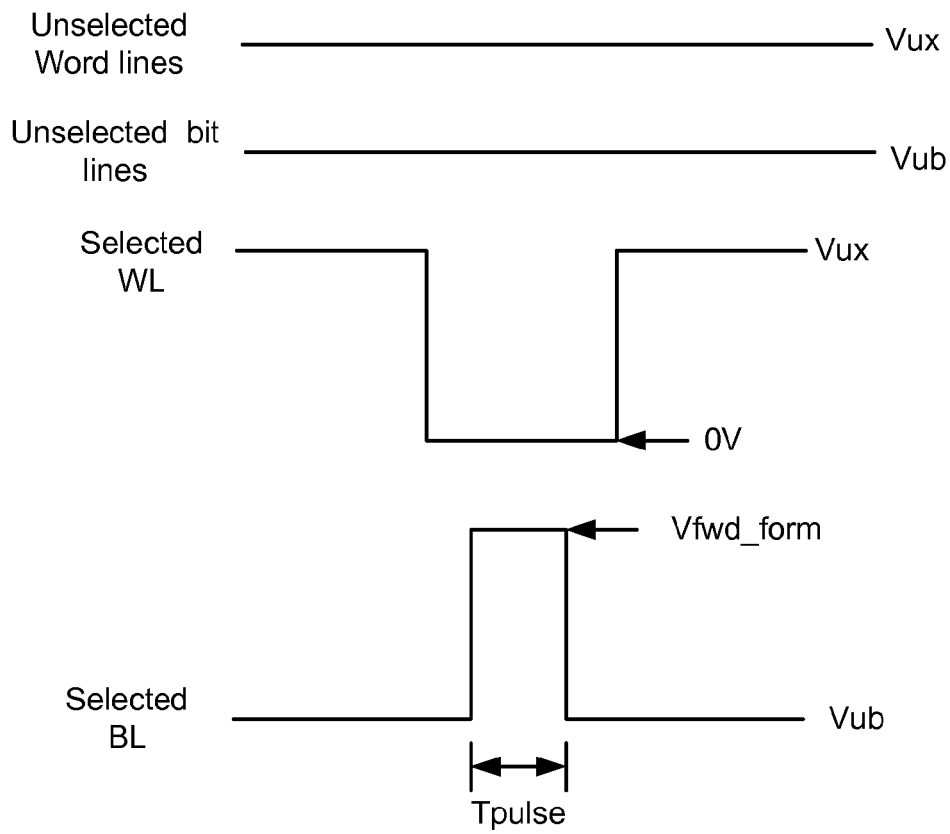
FIGS. 9A and 9B depict signals that are applied to a selected word line and a selected bit line when forming a memory element.

The following describes additional details of applying bias voltages to bit lines and word lines for an embodiment in which the steering element 204 is a diode. FIG. 9A depicts example voltages applied to bias the word lines and bit lines when applying the Vfwd_form. These voltages may be used with the biasing scheme of FIG. 8A. As depicted in FIG. 9A, initially Vux may be applied to all word lines and Vub may be applied to all bit lines. The voltages on the unselected word lines and unselected bit lines may remain relatively constant after they are initially established.

In contrast, the voltages on the selected word line and selected bit line are changed in order to apply Vfwd_form to the memory cell. In one embodiment, the bias to the selected word line changed from Vux to ground. After the voltage on the selected word line is at ground, the voltage on the selected bit line is raised from Vub to Vfwd_form. The selected bit line is held at Vfwd_form for a time period TPulse. An example range for Tpulse is between 0.1 microsecond and 10 microseconds. However, Tpulse could be shorter or longer. Then, the voltage on the selected bit line is dropped back to Vub (e.g., 0.5V). Finally, the voltage on the selected word line is raised back to Vux.

In embodiments in which the steering element is a p-i-n diode, Vux may be about 5.5V, Vub may be about 0.5V and Vfwd_form may be about 6V. The diode may have a breakdown voltage of between about 5.5V and 6.5V, although the breakdown voltage could be higher or lower. In some embodiments in which the steering element 204 is a punch-thru diode, Vux may be about 5V, Vub may be about 3V and Vfwd_form may be about 8V. Note that the values herein for Vux, Vub, and Vfwd_form are examples and that other values could be used.

Figure 9B:
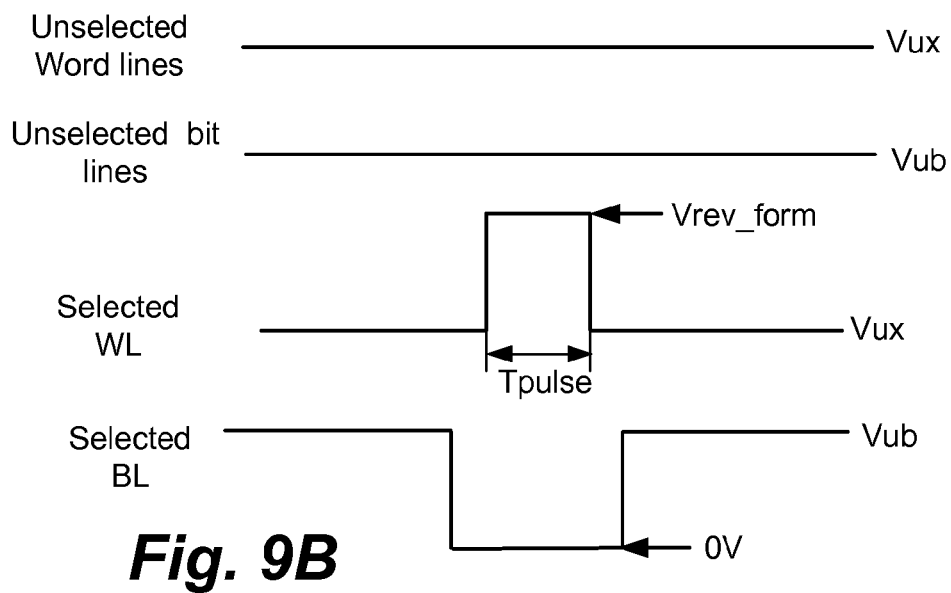

FIG. 9B depicts waveforms that may be applied to bit lines and word lines when applying Vrev_form. These voltages may be used with the biasing scheme of FIG. 8B. FIG. 9B depicts Vux applied to word lines and Vub applied to bit lines. The voltages on the unselected word lines and unselected bit lines may remain relatively constant after they are initially established. In one embodiment, the bias to the selected bit line is changed from Vub to ground and then the bias to the selected word line is changed from Vux to Vrev_form in order to apply Vrev_form. After holding the selected word line at Vrev_form for a time period "Tpulse," the voltage on the selected word line is returned to Vux. The duration of Tpulse may be in the range of 10 nanoseconds to 500 nanoseconds. However, Tpulse may have a greater or shorter duration. Note that there is a "reverse voltage" across the memory cell 200 during Tpulse. This is referred to as a reverse voltage because the voltage goes lower on the selected bit line than the selected word line. In some embodiments, the reverse voltage causes a diode 204 in the memory cell 200 to be reversed biased. In one embodiment, the breakdown voltage of the diode is between 5.5 and 6.5 V. However, the breakdown voltage of the diode could be higher or lower. In embodiments in which the steering element is a p-i-n diode, Vux may be about 5V, Vub may be about 5V, and Vrev_form may be about 10V. In embodiments in which the steering element is a punch-thru diode, Vux may be about 3V, Vub may be about 5V, and Vrev_form may be about 8V.

Figure 10:
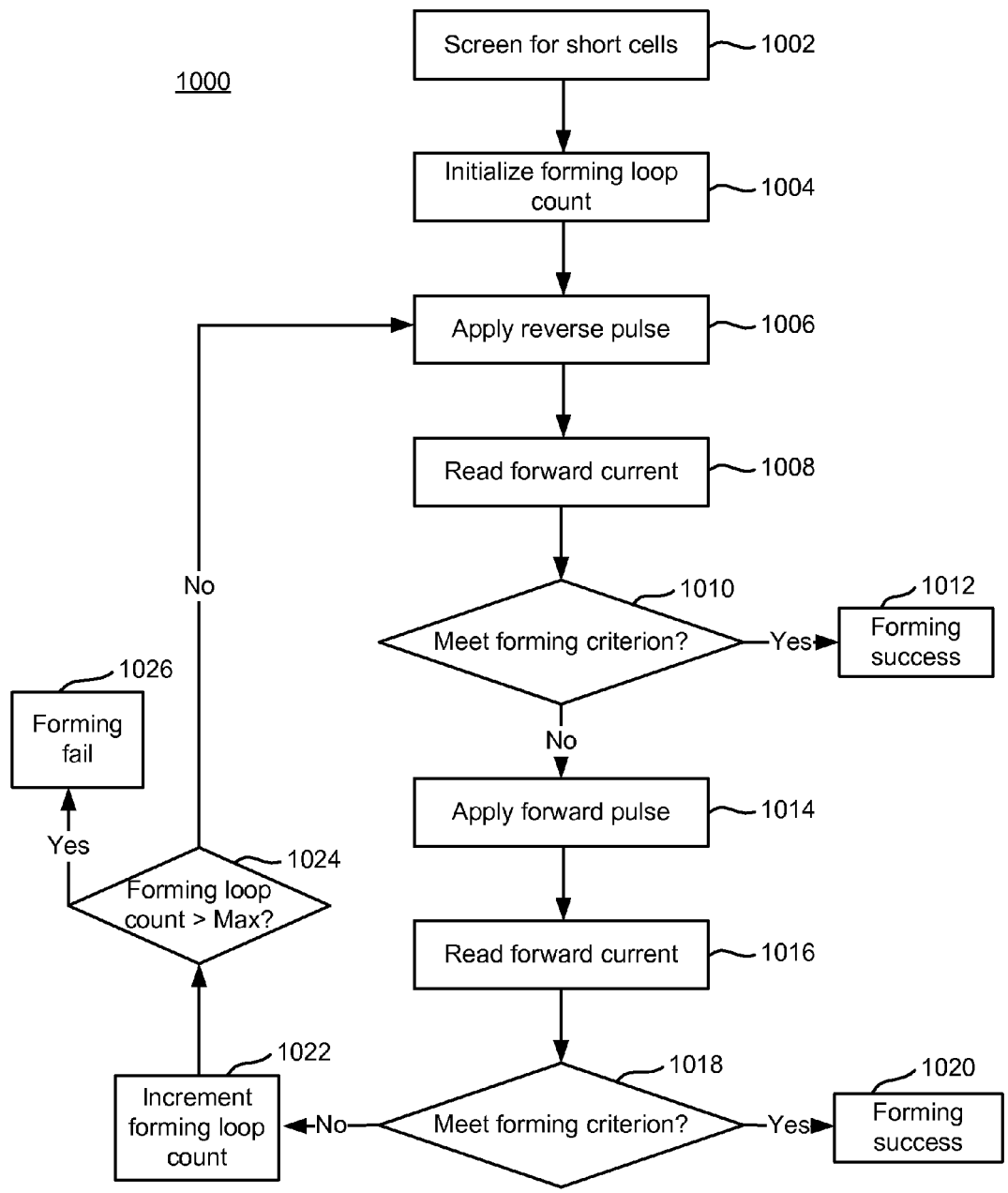
FIG. 10 is a flow diagram of one embodiment of a process of FORMING a reversible resistivity-switching element.

FIG. 10 is a flow diagram of one embodiment of a process 1000 of FORMING a reversible resistivity-switching element 202. In some embodiments, the process 1000 is used for FORMING when the storage elements will be switched using bipolar switching. However, unipolar switching may also be performed. In some embodiments, the storage elements include a metal oxide layer 230. However, storage elements based on other materials may be used. For example, materials that may require or benefit from a FORMING step may be suitable for the process.

An initial check is made to screen for defective storage elements in step 1002. In one embodiment, storage elements are read by applying a first voltage that forward biases the steering elements 204 and a second voltage that reverse biases the steering elements 204. An example forward bias voltage is 1.5V, but this could be higher or lower. An example reverse bias voltage is 3.0V, but this could be higher or lower. If the current that is read exceeds a threshold the storage elements may be screened as a "short cell." Processing may continue with those cells not marked as defective.

In step 1004, a FORMING loop count is initialized. The FORMING loop count determines how many cycles of applying reverse and forward voltages to a given memory cell will be attempted. An example maximum number of cycles is 100; however, a lower or higher number could be used.

In step 1006, a single short reverse pulse is applied. In some embodiments, a reverse pulse is achieved by applying a voltage that reverse biases a steering element 204. An example magnitude for the reverse pulse is 8.0V; however, the pulse could have a lower or higher magnitude. In some embodiments, this may result in about 2.0-3.0 V across the reversible resistivity-switching element; however, the element may experience a larger or smaller voltage. An example duration for the pulse is 50 nanoseconds (ns); however, the pulse could have a shorter or longer duration. In some embodiments, the current is limited while applying the reverse pulse. As one example, the current may be limited to about 5 microamperes; however, the current limit may be higher or lower. In one embodiment, the biasing scheme of FIG. 8B is used in step 1004. In one embodiment, the voltages applied to the bit lines and word lines have waveforms similar to those of FIG. 9B.

In step 1008, storage elements are read with a forward voltage to determine whether or not FORMING has been completed. An example magnitude for the read is 1.5V; however, the voltage could be higher or lower. This may be the same read voltage used in the initial check, but that is not required.

In step 1010, the read current for each storage element is compared to one or more FORMING criteria. For example, the read current is compared to one or more current magnitudes. In one embodiment, at this point the determination is whether the current is greater than a threshold that is associated with the resistance being sufficiently low.

If this test passes, then additional tests can be performed (final check). In one embodiment, the final tests are similar to the initial check in which a read in the reverse direction is performed. However, a different check could be performed. In one embodiment, storage element is read by applying a first voltage that forward biases the steering element and a second voltage that reverse biases the steering element. An example forward bias voltage is 1.5V, but this could be higher or lower. An example reverse bias voltage is 3.0V, but this could be higher or lower. If the current that is read exceeds a threshold, the storage element may be screened as a "short cell." Thus, the storage element is marked as having either passed FORMING or as being defective.

Continuing now with the case in which FORMING did not pass (step 1010=no), a single short forward pulse is applied in step 1014. The pulse may have a magnitude of about 7.0V; however, the magnitude could be higher or lower. This may result in about 4.0V across the reversible resistivity-switching element; however, the element may experience a higher or lower voltage. In one embodiment, the pulse duration is about 1 microsecond; however, the pulse can be longer or shorter. In some embodiments, the current is limited while applying the forward pulse. As one example, the current may be limited to about 5 microamperes; however, the current limit may be higher or lower. In one embodiment, the biasing scheme of FIG. 8A is used in step 1014. In one embodiment, the voltages applied to the bit lines and word lines have waveforms similar to those of FIG. 9A.

Storage elements are then read with a forward voltage, in step 1016. An example magnitude is 1.5V; however, the voltage could be higher or lower. This may be the same read voltage used in the initial check, but that is not required.

The read current for each storage element is compared to one or more FORMING criteria in step 1018. For example, the read current is compared to one or more current magnitudes. In one embodiment, at this point the determination is whether the current is greater than a threshold that is associated with the resistance being sufficiently low.

If this test passes, then additional tests can be performed (final check). In one embodiment, storage element is read by applying a first voltage that forward biases the steering element and a second voltage that reverse biases the steering element. An example forward bias voltage is 1.5V, but this could be higher or lower. An example reverse bias voltage is 3.0V, but this could be higher or lower. If the current that is read exceeds a threshold, the storage element may be screened as a "short cell." Thus, the storage element is marked as having either passed FORMING or as being defective.

If the storage element did not pass after the forward FORMING voltage (step 1018=no), then the FORMING loop count is incremented in step 1022. If the FORMING loop count is greater than the maximum number of attempts, then FORMING fails for this memory cell. The memory cell may be marked as bad in step 1026. The process 1000 then ends for this memory cell.

So long as the retry count has not reached the maximum, the process 1000 returns to step 1006 to apply a single reverse pulse of short duration. In some embodiments, the magnitude of the reverse voltage pulse is the same with each iteration. In some embodiments, the magnitude of the forward voltage pulse is the same with each iteration. In some embodiments, the duration of the reverse voltage pulse is the same with each iteration. In some embodiments, the duration of the forward voltage pulse is the same with each iteration. However, it is possible to change the magnitude of the reverse and/or forward voltage in different iterations. It is also possible to change the duration of the reverse and/or forward voltage in different iterations. It is also possible to use a different current limit in different iterations.

Note that while the process 1000 of FIG. 10 was described as applying a single reverse pulse, then a single forward pulse, in some embodiments, more than one pulse of the same polarity may be applied in a row. In some embodiments, the forward and reverse pulses in the process of FIG. 8 are "blind pulses." For example, the pulse is applied without regard for any condition of the storage element such as its present resistance. Also that while the process 1000 of FIG. 10 started with a reverse pulse. However, in another embodiment, the process 1000 starts with a forward pulse.

Embodiments disclosed herein include a method of FORMING a memory cell having a reversible resistivity-switching memory element. The method comprises alternating between applying one or more first voltages having a first polarity to the memory cell and applying one or more second voltages having a second polarity that is opposite the first polarity to the memory cell until the reversible resistivity-switching memory element is formed.

One embodiment includes a storage system, comprising a non-volatile memory cell including a reversible resistivity-switching memory element and one or more management circuits in communication with the memory cell. The one or more management circuits alternate between applying one or more voltages having a first polarity to the memory cell and applying one or more voltages to the memory cell having a second polarity that is opposite the first polarity until the reversible resistivity-switching memory element is formed.

One embodiment includes a method of FORMING a reversible resistivity-switching memory element. The method comprises the steps of: a) applying a voltage pulse having a first polarity to a memory cell having a reversible resistivity-switching memory element and a steering element, the voltage pulse having the first polarity forward biases the steering element; b) determining whether the reversible resistivity-switching memory meets one or more FORMING criterion after applying the voltage pulse having the first polarity; c) applying a voltage pulse having a second polarity to the memory cell if the reversible resistivity-switching memory does not meet the one or more FORMING criteria after applying the voltage pulse having the first polarity, the second polarity is opposite the first polarity; and d) repeating steps a) through c) until the reversible resistivity-switching memory meets the one or more FORMING criterion.

One embodiment includes a storage system, comprising a plurality of non-volatile memory cells arranged in a cross-point array and one or more management circuits in communication with the plurality of non-volatile memory cells. Individual ones of the memory cells include a reversible resistivity-switching memory element and a steering element. The one or more management circuits apply a voltage pulse having a first polarity to a first of the memory cells having a first of the steering elements. The voltage pulse having the first polarity forward biases the first steering element. The one or more management circuits determine whether the first memory cell meets one or more FORMING criterion after applying the voltage pulse having the first polarity. The one or more management circuits apply a voltage pulse having a second polarity to the first memory cell if the first memory cell is not formed after applying the voltage pulse having the first polarity. The second polarity is opposite the first polarity. The one or more management circuits apply an additional voltage pulse having the first polarity and an additional voltage pulse having the second polarity alternately until the first memory cell meets the one or more FORMING criterion.

One embodiment includes a storage system including a first plurality of conductors, a second plurality of conductors, and a plurality of non-volatile memory cells coupled between the first and second plurality of conductors in a cross-point array configuration. Each of the memory cells includes a reversible resistivity-switching memory element and a steering element. The storage system also includes one or more management circuits are in communication with the plurality of non-volatile memory cells. The one or more management circuits alternate between applying a voltage to respective ones of the memory cells that reverse biases the steering element for the respective memory cell and applying a voltage to the respective memory cell that forward biases the steering element for the respective memory cell until the reversible resistivity-switching memory element for the respective memory cell meets one or more FORMING criterion.

The foregoing detailed description has been presented for purposes of illustration and description. It is not intended to be exhaustive or be limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A method of forming a memory cell having a reversible resistivity-switching memory element, the method comprising:

alternating between applying one or more first voltages having a first polarity to the memory cell and applying one or more second voltages having a second polarity that is opposite the first polarity to the memory cell until the reversible resistivity-switching memory element is formed.

2. The method of claim 1, wherein the one or more voltages having the first polarity include one or more first voltage pulses, and wherein the one or more voltages having the second polarity include one or more second voltage pulses.

3. The method of claim 2, wherein the one or more first voltage pulses are longer than the one or more second voltage pulses.

4. The method of claim 3, wherein the one or more first voltage pulses are at least 10 times longer than the one or more second voltage pulses.

5. The method of claim 1, wherein the memory cell includes a steering element, the one or more voltages having the first polarity forward biases the steering element.

6. The method of claim 1, wherein the alternating between applying one or more first voltages and applying one or more second voltages includes alternating between applying a single first pulse having the first polarity with applying a single second pulse having the second polarity.

7. The method of claim 1, wherein the reversible resistivity-switching memory element includes a transition metal oxide.

8. A storage system, comprising:

a non-volatile memory cell including a reversible resistivity-switching memory element; and one or more management circuits in communication with the memory cell, the one or more management circuits alternate between applying one or more voltages having a first polarity to the memory cell and applying one or more voltages to the memory cell having a second polarity that is opposite the first polarity until the reversible resistivity-switching memory element is formed.

9. The storage system of claim 8, wherein the one or more voltages having the first polarity include one or more first voltage pulses, and wherein the one or more voltages having the second polarity include one or more second voltage pulses.

10. The storage system of claim 9, wherein the one or more first voltage pulses are longer than the one or more second voltage pulses.

11. The storage system of claim 10, wherein the one or more first voltage pulses are at least 10 times longer than the one or more second voltage pulses.

12. The storage system of claim 9, wherein the one or more first voltage pulses are a single first pulse, the one or more second voltage pulses are a single second pulse.

13. The storage system of claim 8, wherein memory cell includes a steering element, the one or more voltages having the first polarity forward biases the steering element.

14. The storage system of claim 8, wherein the reversible resistivity-switching memory element includes a transition metal oxide.

15. A method of forming a reversible resistivity-switching memory element, the method comprising the steps of:

a) applying a voltage pulse having a first polarity to a memory cell having a reversible resistivity-switching memory element and a steering element, the voltage pulse having the first polarity forward biases the steering element;

b) determining whether the reversible resistivity-switching memory element meets one or more forming criterion after applying the voltage pulse having the first polarity;

c) applying a voltage pulse having a second polarity to the memory cell if the reversible resistivity-switching memory element does not meet the one or more forming criteria after applying the voltage pulse having the first polarity, the second polarity is opposite the first polarity; and d) repeating steps a) through c) until the reversible resistivity-switching memory element meets the one or more forming criterion.

16. The method of claim 15, wherein the voltage pulse having the first polarity is longer than the voltage pulse having the second polarity.

17. The method of claim 16, wherein the voltage pulse having the first polarity is at least 10 times longer than the voltage pulse having the second polarity.

18. The method of claim 15, wherein the reversible resistivity-switching memory element includes a transition metal oxide.

19. The method of claim 15, further comprising determining whether the reversible resistivity-switching memory element meets the one or more forming criterion after applying the voltage pulse having the second polarity.

20. A storage system, comprising:

a plurality of non-volatile memory cells arranged in a cross-point array, individual ones of the memory cells including a reversible resistivity-switching memory element and a steering element; and one or more management circuits in communication with the plurality of non-volatile memory cells, the one or more management circuits apply a voltage pulse having a first polarity to a first of the memory cells having a first of the steering elements, the voltage pulse having the first polarity forward biases the first steering element, the one or more management circuits determine whether the first memory cell meets one or more forming criterion after applying the voltage pulse having the first polarity, the one or more management circuits apply a voltage pulse having a second polarity to the first memory cell if the first memory cell is not formed after applying the voltage pulse having the first polarity, the second polarity is opposite the first polarity, the one or more management circuits apply an additional voltage pulse having the first polarity and an additional voltage pulse having the second polarity alternately until the first memory cell meets the one or more forming criterion.

21. The storage system of claim 20, wherein the reversible resistivity-switching memory element includes a transition metal oxide.

22. The storage system of claim 20, wherein the steering element is a diode.

23. The storage system of claim 20, wherein the one or more management circuits determine whether the first memory cell meets the one or more forming criterion after applying the voltage pulse having the second polarity.

24. A storage system, comprising:
a first plurality of conductors;
a second plurality of conductors; and
a plurality of non-volatile memory cells coupled between the first and second plurality of conductors in a cross-point array configuration, each of the memory cells includes a reversible resistivity-switching memory element and a steering element;

a one or more management circuits in communication with the plurality of non-volatile memory cells, the one or more management circuits alternate between applying a voltage to respective ones of the memory cells that reverse biases the steering element for the respective memory cell and applying a voltage to the respective memory cell that forward biases the steering element for the respective memory cell until the reversible resistivity-switching memory element for the respective memory cell meets one or more forming criterion.

* * * * *